United States Patent
Kim

(10) Patent No.: US 8,022,742 B2
(45) Date of Patent: Sep. 20, 2011

(54) CIRCUIT FOR REDUCING DUTY DISTORTION IN A SEMICONDUCTOR MEMORY DEVICE

(75) Inventor: Chan-kyung Kim, Hwaseong-si (KR)

(73) Assignee: Samsung Electronics Co., Ltd., Maetan-dong, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 12/651,725

(22) Filed: Jan. 4, 2010

(65) Prior Publication Data
US 2010/0171555 A1 Jul. 8, 2010

(30) Foreign Application Priority Data
Jan. 7, 2009 (KR) ........................ 10-2009-0001243

(51) Int. Cl.
 *H03K 7/08* (2006.01)
(52) U.S. Cl. ................... 327/175; 327/291; 330/258
(58) Field of Classification Search .................. 327/175, 327/291; 330/258
See application file for complete search history.

(56) References Cited

U.S. PATENT DOCUMENTS

| 5,332,934 | A | 7/1994 | Hashimoto et al. |
| 5,703,532 | A | 12/1997 | Shin et al. |
| 7,317,358 | B2 * | 1/2008 | Murakami .................... 330/261 |

FOREIGN PATENT DOCUMENTS

| JP | 2003-069353 | 7/2003 |
| JP | 2005-192258 | 7/2005 |

* cited by examiner

*Primary Examiner* — Kenneth B. Wells
(74) *Attorney, Agent, or Firm* — Muir Patent Consulting, PLLC

(57) ABSTRACT

A circuit for outputting an amplified clock signal is disclosed. The circuit includes a first input terminal for inputting a first clock signal, a second input terminal for inputting a second clock signal, a first amplifier circuit for amplifying the first clock signal and outputting a first amplified clock signal at a first output terminal, and a second amplifier circuit for amplifying the second clock signal and outputting a second amplified clock signal at a second output terminal. The circuit additionally includes a level maintenance circuit connected to the first output terminal and the second output terminal. The circuit further includes an output circuit connected to the first output terminal and the second output terminal and configured to output a further amplified clock signal based on the first amplified clock signal and the second amplified clock signal. The level maintenance circuit is configured to reduce duty distortion in the further amplified clock signal.

15 Claims, 5 Drawing Sheets

CIRCUIT FOR REDUCING DUTY DISTORTION IN A SEMICONDUCTOR MEMORY DEVICE

CROSS-REFERENCE TO RELATED APPLICATIONS

This application claims the benefit of Korean Patent Application No. 10-2009-0001243, filed on Jan. 7, 2009, in the Korean Intellectual Property Office, the disclosure of which is incorporated herein in its entirety by reference.

BACKGROUND

1. Field

This application relates to a converter, and more particularly, to a converter for modifying an output of a differential amplifier to reduce duty distortion of an output signal.

2. Description of Related Art

Input clock signals for semiconductor devices are often amplified and converted before being output for use in the semiconductor device. For example, two clock signals may be inputted into an amplification and conversion circuit such that the resulting output signal is a single clock signal having a larger voltage swing than the initial clock signals. In some of these systems, however, there exists a duty distortion in the output signal when the system transitions from the standby mode to the operating mode. The duty distortion may cause an initial delay when the system transitions from a standby mode to an operational mode.

SUMMARY

According to one embodiment, a converter is disclosed. The converter includes a first differential amplifier receiving a first input clock signal via a first input terminal and a second input clock signal via a second input terminal, and outputting a first amplified clock signal via an output terminal. The converter additionally includes a second differential amplifier receiving the first input clock signal via a first input terminal and the second input clock signal via a second input terminal, and outputting a second amplified clock signal via an output terminal. The converter further includes a level maintenance circuit connected to the output terminal of the first differential amplifier and the output terminal of the second differential amplifier, and causing the common mode voltage of the output terminals of the first differential amplifier and the second differential amplifier in a standby mode to be substantially equal to a common mode voltage of the output terminals of the first and second differential amplifiers in an operating mode.

According to another embodiment, a level maintenance circuit is disclosed. The level maintenance circuit includes a first terminal connected to a voltage divider circuit, an output buffer circuit, and an output of a first clock generator circuit, and a second terminal connected to the voltage divider circuit, the output buffer circuit, and an output of a second clock generator circuit. The voltage divider is configured to lower a maximum standby voltage and raise a minimum standby voltage at the output of the first clock generator circuit, and to lower a maximum standby voltage and raise a minimum standby voltage at the output of the second clock generator circuit.

According to a further embodiment, a circuit for outputting an amplified clock signal is disclosed. The circuit includes a first input terminal for inputting a first clock signal, a second input terminal for inputting a second clock signal, a first amplifier circuit for amplifying the first clock signal and outputting a first amplified clock signal at a first output terminal, and a second amplifier circuit for amplifying the second clock signal and outputting a second amplified clock signal at a second output terminal. The circuit additionally includes a level maintenance circuit connected to the first output terminal and the second output terminal. The circuit further includes an output circuit connected to the first output terminal and the second output terminal and configured to output a further amplified clock signal based on the first amplified clock signal and the second amplified clock signal. The level maintenance circuit is configured to reduce duty distortion in the further amplified clock signal.

BRIEF DESCRIPTION OF THE DRAWINGS

Exemplary embodiments will be more clearly understood from the following detailed description taken in conjunction with the accompanying drawings in which.

Figure 1:
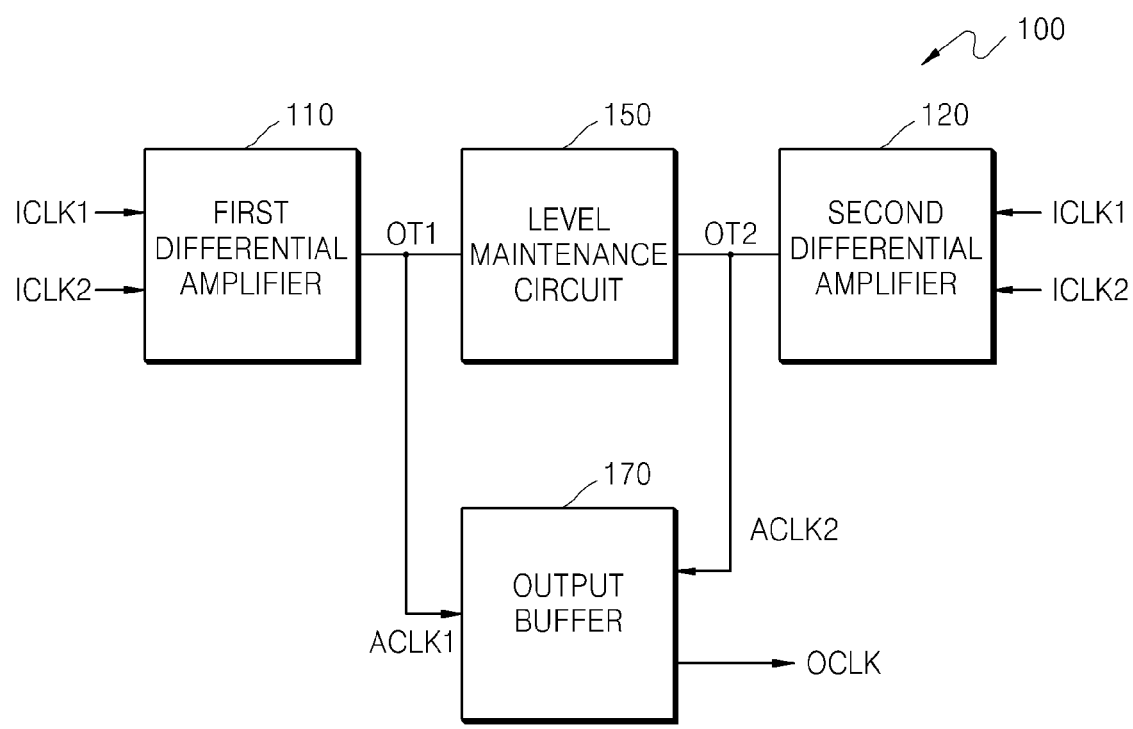
FIG. 1 is a block diagram of an exemplary converter consistent with certain disclosed embodiments.

It should be noted that these figures are intended to illustrate the general characteristics of methods, structure, and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative size and positioning components and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments will now be described more fully with reference to the accompanying drawings. Example embodiments may, however, be embodied in many different forms and should not be construed as being limited to the embodiments set forth herein. Rather, these embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, unless noted otherwise, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of an exemplary converter 100 consistent with certain disclosed embodiments. Referring to FIG. 1, the converter 100 comprises a converter circuit, which includes a first differential amplifier 110, a second differential amplifier 120, a level maintenance circuit 150, and an output buffer 170.

In one embodiment, the first differential amplifier 110 comprises a first differential amplifier circuit, which receives a first input clock signal ICLK1 and a second input clock signal ICLK2, and generates a first amplified clock signal ACLK1 by amplifying the difference between the first input clock signal ICLK1 and the second input clock signal ICLK2. The second differential amplifier 120 comprises a second differential amplifier circuit, which receives the first input clock signal ICLK1 and the second input clock signal ICLK2 and generates a second amplified clock signal ACLK2 by amplifying the difference between the first input clock signal ICLK1 and the second input clock signal ICLK2. The first and second differential amplifier circuits may be referred to as clock generator circuits. The output buffer 170 comprises an output buffer circuit, which receives and amplifies the first amplified clock signal ACLK1 generated by the first differential amplifier 110 and the second amplified clock signal ACLK2 generated by the second differential amplifier 120, and outputs the amplified signal OCLK. In one embodiment, first input clock signal ICLK1 and second input clock signal ICLK2 each begin in a standby mode during which one of the signals remain in either a low or high state (e.g., low voltage state or high voltage state) and the other signal remains in the opposite state, such that neither signal oscillates between low and high. Subsequently the signals transition to an operating mode in which each signal oscillates in an opposite manner, such that when ICLK1 is high, ICLK2 is low, and vice versa. In this embodiment, first amplified clock signal ACLK1 and second amplified clock signal ACLK2 also begin in a standby mode, and then transition to an operating mode in conjunction with the transition of ICLK1 and ICLK2.

The level maintenance circuit 150 is connected to an output terminal OT1 of the first differential amplifier 110 and an output terminal OT2 of the second differential amplifier 120. In one embodiment, the level maintenance circuit 150 causes the voltage of the output terminal OT1 of the first differential amplifier 110 and the voltage of the output terminal OT2 of the second differential amplifier 120 in a standby mode to be equal to a common mode voltage of the outputs of the first and second differential amplifiers 110 and 120 in an operating mode. That is, with or without the inclusion of the level maintenance circuit, the common mode voltage (e.g., one half the vector sum of the voltages from output terminal OT1 and output terminal OT2) may be a certain value when the system is in operating mode. In one embodiment, the level maintenance circuit 150 causes the common mode voltage for the output terminals OT1 and OT2 when in standby mode to be the same, or substantially the same value as the common mode voltage in the operating state. The common mode voltage is therefore an intermediate voltage in the range of voltages in which the first and second amplified clock signals ACLK1 and ACLK2 generated by the first differential amplifier 110 and the second differential amplifier 120 swing.

However, the level maintenance circuit 150 need not cause the voltages for the output terminals OT1 and OT2 to have the same or substantially the same common mode voltage when in a standby state as when in an operating state. Instead, the level maintenance circuit 150 can be configured to cause the voltage at the high state (i.e., maximum voltage) for OT1 and OT2 when in standby mode to be lower than the voltage at the high state when the level maintenance circuit is not used, and can similarly be configured to cause the voltage at the low state (i.e., minimum voltage) for OT1 and OT2 when in standby mode to be higher than the voltage at the low state when the level maintenance circuit is not used, regardless of whether the maximum and minimum voltages achieve the same common mode voltage in both the standby and the operating states.

When transiting from the standby mode to the operating mode, the level maintenance circuit 150 may allow the voltages of the output terminal OT1 of the first differential amplifier 110 and the output terminal OT2 of the second differential amplifier 120 to transition starting from the adjusted standby voltages (e.g., the common mode voltages, the lower maximum voltage and higher minimum voltage, etc.). In this case, it is possible to minimize the changes in the amplitudes of the voltages of the output terminal OT1 and the output terminal OT2 right after switching to the operating mode from the standby mode. As a result, because the voltages are closer to a threshold voltage required to switch the transistors between states in the output buffer 170 (discussed further below), it is possible to minimize or decrease duty distortion in the first amplified clock signal ACLK1 generated by the first differential amplifier 110 and the second amplified clock signal ACLK2 generated by the second differential amplifier 120, and in the output buffer 170 clock signal OCLK right after switching to the operating mode from the standby mode. Accordingly, the waveform of a clock signal that is first generated when switching from the standby mode to the operating mode may be almost the same as subsequent waveforms of the clock signal.

Figure 5A:
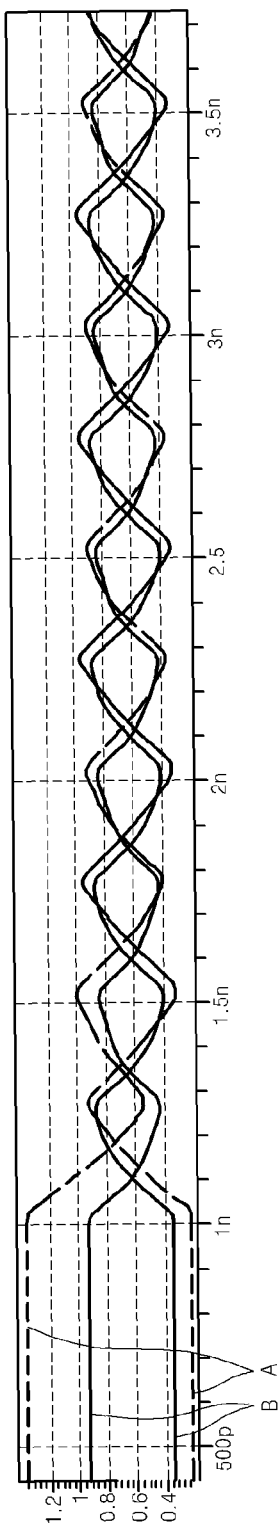
FIGS. 5A-5C are exemplary timing diagrams illustrating the operations of the exemplary converter circuits disclosed in FIGS. 2 to 4.
Figure 5B:
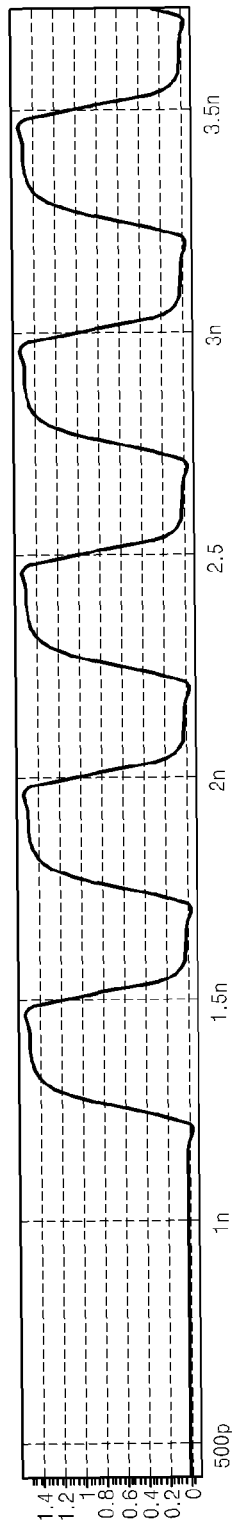
Figure 5C:
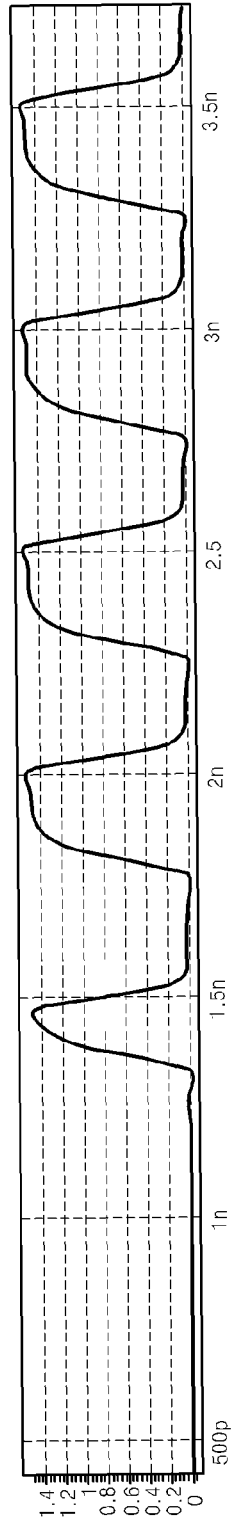

As discussed above, in the standby mode, the level maintenance circuit 150 may maintain the voltages of the output terminal OT1 of the first differential amplifier 110 and the output terminal OT2 of the second differential amplifier 120 to be equal to the common mode voltage that exists during operating mode. The level maintenance circuit 150 may additionally, or alternatively set the voltage of the output terminal OT1 and the voltage of the output terminal OT2 in the standby mode to fall within a set of voltages that fall within a range of values around which the first amplified clock signal ACLK1 and the second amplified clock signal ACLK2 swing in the operating mode. For example, if the voltages of the output terminal OT1 and the output terminal OT2 in the operating mode swing from 0.5 V to 0.8 V, then the voltages of the output terminals OT1 and OT2 in the standby mode can be 0.4 V and 0.9 V respectively, or can alternatively be 0.5 V and 0.8 V respectively. Other standby voltage values within a nearby range of the operating swing voltage may be set by adjusting the level maintenance circuit 150. On the other hand, when the level maintenance circuit 150 is not used, in a situation where the operating mode swing is from 0.5 V to 0.8 V, the output terminals OT1 and OT2 in the standby mode may vary significantly more (e.g., having respective values of 0.2 V and 1.3 V). FIGS. 5A-5C, discussed further below, depict exemplary swing voltages for situation that do and do not use a level maintenance circuit.

Figure 2:
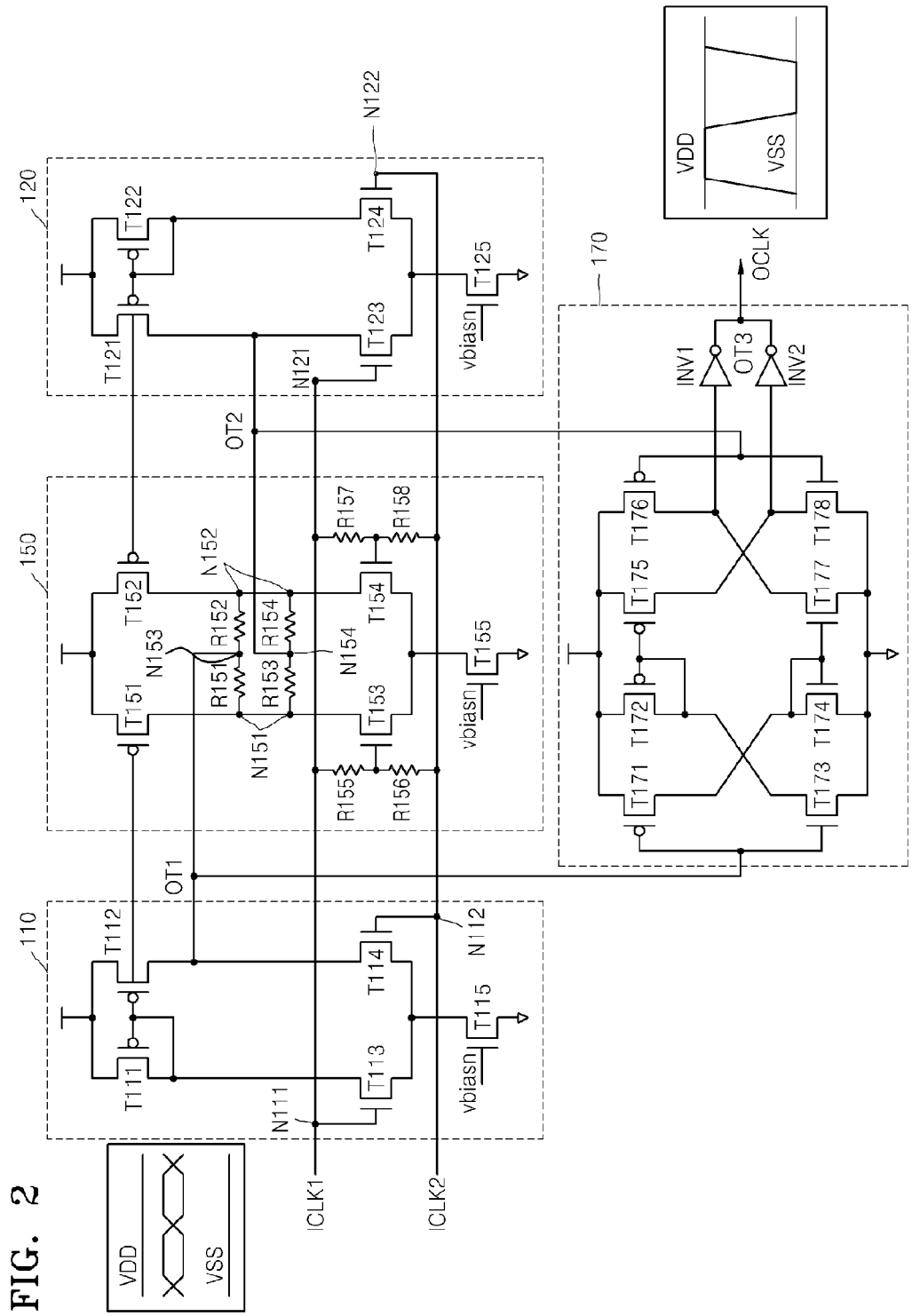
FIG. 2 is a circuit diagram of an exemplary circuit consistent with certain disclosed embodiments.

FIG. 2 is a circuit diagram of an exemplary converter consistent with certain disclosed embodiments. Referring to FIG. 2, the level maintenance circuit 150 includes first through fourth transistors T151 to T154 and first through eighth resistors R151 to R158.

The first and third transistors T151 and T153 are connected in series and the second and fourth transistors T152 and T154 are connected in series.

The first and second resistors R151 and R152 are connected in series between a first node N151 and a second node N152, and the third and fourth resistors R153 and R154 are also connected in series between the first node N151 and the second node N152. The first node N151 is located between the first and third transistors T151 and T153, and the second node N152 is located between the second and fourth transistors T152 and T154.

The fifth and sixth resistors R155 and R156 are connected in series between a first input terminal N111 and a second input terminal N112 of the first differential amplifier 110, and the seventh and eighth resistors R157 and R158 are connected in series between a first input terminal N121 and a second input terminal N122 of the second differential amplifier 120. A gate of the third transistor T153 is connected between the fifth and sixth resistors R155 and R156, and a gate of the fourth transistor T154 is connected between the seventh and eighth resistors R157 and R158. Fifth transistor T155 may be connected between the third transistor T153 and the fourth transistor T154. In one embodiment, fifth transistor T155, as well as transistors T115 and T125 in differential amplifiers 110 and 120 are turned on during both standby mode and operating mode, based on a voltage vbiasn applied to the gates.

The output terminal OT1 of the first differential amplifier 110 is connected between the first and second resistors R151 and R152, and the output terminal OT2 of the second differential amplifier 120 is connected between the third and fourth resistors R153 and R154. As a result, because the resistors R151, R152, R153, and R154 serve as a voltage divider, the output terminal OT1 of the first differential amplifier 110 and the output terminal OT2 of the second differential amplifier 120 are set to have a voltage between the voltage of the first node N151 and the voltage of the second node N152. For example, in one embodiment, resistors R151-R158 may be chosen so that the common mode voltage of the output terminal OT1 of the first differential amplifier 110 and the voltage of the output terminal OT2 of the second differential amplifier 120 in standby mode may be set to be equal to a common mode voltage that occurs during the operating mode.

In one embodiment, the transistors in the level maintenance circuit 150 are selected such that the current flowing through the transistor T151 corresponds to the current flowing through a current mirror of the first differential amplifier 110, and the current flowing through the transistor T152 corresponds to current flowing a current mirror of the second differential amplifier 120. That is, transistors T112 and T114 (and T115) of differential amplifier 110 may be the same sized transistors as respective transistors T151 and T153 (and T155) of level maintenance circuit 150, such that the current flowing through transistors T112, T114, and T115 is approximately the same as the current flowing through transistors T151, T153, and T155. Similarly, transistors T121 and T123 (and T125) of differential amplifier 120 may be the same sized transistors as respective transistors T152 and T153 (and T155) of level maintenance circuit 150, such that the current flowing through transistors T121, T123, and T125 is approximately the same as the current flowing through transistors T152, T154, and T155.

In one embodiment, the first and second output terminals OT1 and OT2 are maintained at a particular common mode voltage and at particular maximum and minimum voltage values in the standby mode that are equal or close to the common mode voltage and maximum and minimum voltage values in operating mode. In this embodiment, when the standby mode is switched to the operating mode, the voltages of the first and second output terminals OT1 and OT2 swing starting from the same or similar voltages as are used during operating mode. Accordingly, it is possible to minimize or decrease duty distortion in the first amplified clock signal ACLK1 generated by the first differential amplifier 110 and second amplified clock signal ACLK2 generated by the second differential amplifier 120, and in the output signal OCLK right after transiting to the operating mode from the standby mode.

Figure 3:
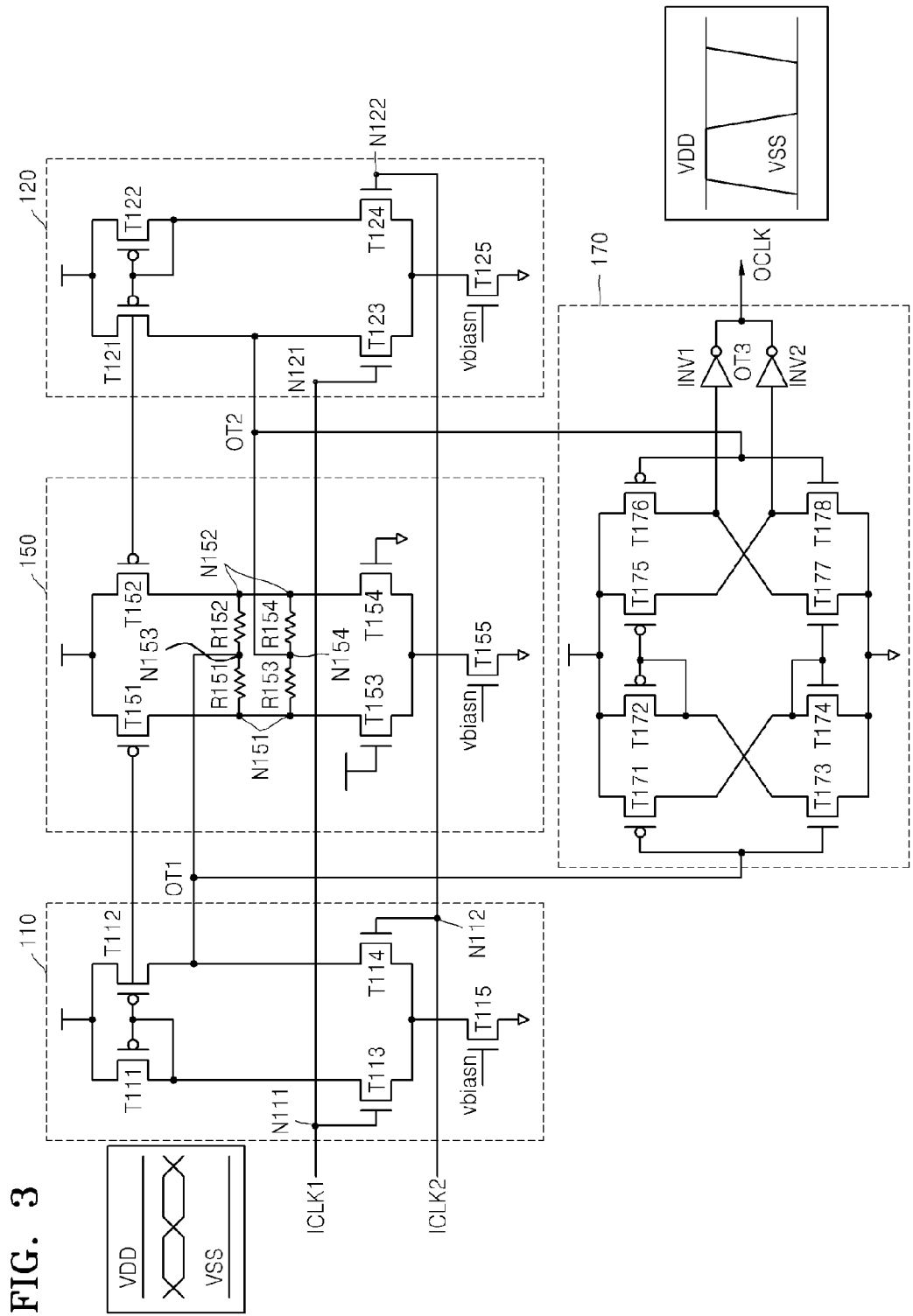
FIG. 3 is a circuit diagram of an exemplary circuit consistent with certain disclosed embodiments.

Output buffer 170 comprises an output buffer circuit that takes as inputs the outputs OT1 from differential amplifier 110 and OT2 from differential amplifier 120, and outputs a single clock signal. In one embodiment, output buffer 170 acts as an amplifier such that the output clock signal has a greater difference between the high and low voltage states than either of the clock signals output from differential amplifiers 110 and 120. In one embodiment, output buffer 170 includes a set of transistors as shown in FIGS. 2 and 3. As such, these transistors require a particular threshold voltage at their gates in order to switch from on to off or vice versa. Therefore reducing the difference between the high and low voltages in the standby mode at outputs OT1 and OT2 and the threshold voltages of the transistors in output buffer 170, increases the speed at which the output buffer 170 responds, thereby reducing duty distortion during the transition between the standby mode and the operating mode.

FIG. 3 is a circuit diagram of an exemplary converter consistent with certain disclosed embodiments. Referring to FIG. 3, the level maintenance circuit 150 includes first through fourth transistors T151 to T154 and first through fourth resistors R151 to R154.

Compared to the level maintenance circuit 150 of FIG. 2, the level maintenance circuit 150 of FIG. 3 does not include the fifth through eighth resistors R155 to R158 included in the level maintenance circuit 150 of FIG. 2. Also, in the level maintenance circuit 150 of FIG. 3, the third transistor T153 is always kept turned on by being connected to a power supply voltage source and the fourth transistor T154 is always kept turned off by being connected to a ground voltage source.

In one exemplary embodiment of the level maintenance circuit 150 of FIG. 3, the voltage of an output terminal OT1 of a first differential amplifier 110 and the voltage of an output terminal OT2 of a second differential amplifier 120 in standby mode are set to values similar to those discussed above in connection with the level maintenance circuit 150 of FIG. 2.

Figure 4:
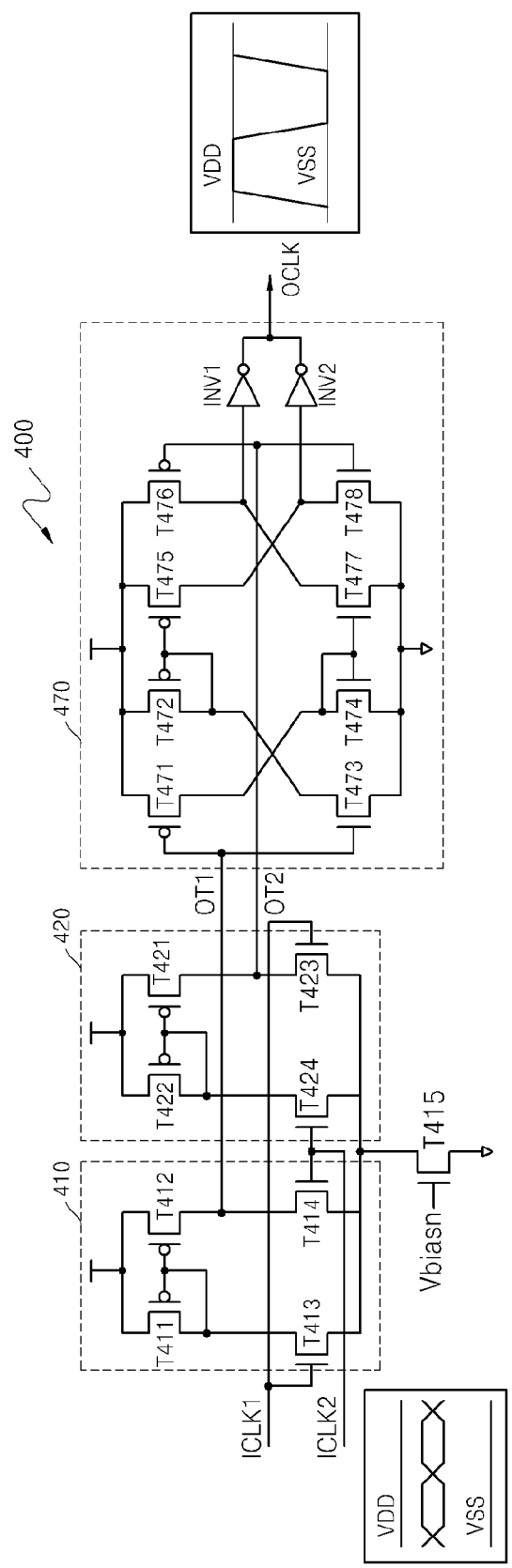
FIG. 4 is a circuit diagram of an exemplary circuit for comparison to certain disclosed embodiments.

FIG. 4 is a circuit diagram of an exemplary converter for comparison to certain disclosed embodiments. Referring to FIG. 4, the converter 400 comprises a converter circuit including a first differential amplifier 410, a second differential amplifier 420, and an output buffer 470.

Compared to the converters 100 illustrated in FIGS. 2 and 3, the converter 400 does not include a level maintenance circuit such as the level maintenance circuits 150 illustrated in FIGS. 2 and 3. Thus, in a standby mode, the outputs of the first and second differential amplifiers 410 and 420 are not set to be equal to a common mode voltage or other values that are equal to or close to the maximum and minimum voltages of the outputs of amplifiers 410 and 420. For example, in the standby mode, the outputs of the first and second differential amplifiers 410 and 420 may be set to be equal to a power supply voltage and a ground voltage, respectively.

In this case, when switching from the standby mode to an operating mode, the voltages of the first and second differential amplifiers 410 and 420 swing from either the power supply voltage or the ground voltage. Thus, duty distortion may occur in clock signals that are output from the first and second differential amplifiers 410 and 420 right after switching to the operating mode from the standby mode.

FIGS. 5A-5C are exemplary timing diagrams illustrating the operations of the exemplary converters disclosed in FIGS. 2 to 4. Referring to FIG. 5A, plot A shows an output signal of the first or second differential amplifier 410 or 420 of the converter 400 of FIG. 4, and plot B shows an output signal of the first or second differential amplifier 110 or 120 of the converter 100 illustrated in FIG. 2 or 3.

Referring to FIG. 5A, in a standby mode, the amplitude difference between voltages of the output signals of plot A is greater than that of the output signals of plot B. Thus, when switching from the standby mode to an operating mode, variation in the amplitude of the voltages of the output signals of plot A is greater than that in the voltages of the output signals of plot B, and it takes longer for the output signals of plot A to reach a threshold voltage required to switch transistors in the output buffer 170 than it does for the output signal of plot B. As a result, duty distortion occurs in the situation depicted in plot A.

Referring to FIGS. 5B and 5C, FIG. 5B shows the output signal of the converter 100 of FIG. 2 or 3 consistent with the output signals OT1 and OT2 depicted in plot B of FIG. 5A, while FIG. 5C shows the output signal of the converter 100 of FIG. 4 consistent with the output signals OT1 and OT2 depicted in plot A of FIG. 5A. As FIGS. 5B and 5C show, duty distortion does not occur in the output signal of the converter 100 of FIG. 2 or 3, whereas duty distortion occurs in the output signal of the converter 400 of FIG. 4.

While different embodiments have been particularly shown and described with reference to the examples described herein, it will be understood that various changes in form and details may be made therein without departing from the spirit and scope of the following claims.

What is claimed is:

1. A converter comprising:
    a first differential amplifier receiving a first input clock signal via a first input terminal and a second input clock signal via a second input terminal, and outputting a first amplified clock signal via an output terminal;
    a second differential amplifier receiving the first input clock signal via a first input terminal and the second input clock signal via a second input terminal, and outputting a second amplified clock signal via an output terminal; and
    a level maintenance circuit connected to the output terminal of the first differential amplifier and the output terminal of the second differential amplifier, and causing the common mode voltage of the output terminals of the first differential amplifier and the second differential amplifier in a standby mode to be substantially equal to a common mode voltage of the output terminals of the first and second differential amplifiers in an operating mode.

2. The converter of claim 1, wherein, during the standby mode, the level maintenance circuit maintains the voltages of the output terminal of the first differential amplifier and the output terminal of the second differential amplifier to be equal to the common mode voltage associated with the operating mode.

3. The converter of claim 1, wherein, when the converter transits from the standby mode to the operating mode, the level maintenance circuit causes the maximum and minimum voltages of the output terminal of the first differential amplifier and the maximum and minimum voltages of the output terminal of the second differential amplifier to be substantially equal to the maximum and minimum voltages of the output terminals in the standby mode.

4. The converter of claim 1, further comprising an output buffer connected between the output terminal of the first differential amplifier and the output terminal of the second differential amplifier, the output buffer receiving the first amplified clock signal output from the output terminal of the first differential amplifier and the second amplified clock signal output from the output terminal of the second differential amplifier, and generating an amplified output clock signal via an output terminal of the output buffer.

5. The converter of claim 4, wherein the voltage of the output clock signal swings between a maximum high voltage substantially equal to a power supply voltage and a minimum low voltage substantially equal to a ground voltage.

6. The converter of claim 4, wherein a range of voltages in which the first amplified clock signal output from the output terminal of the first differential amplifier and the second amplified clock signal output from the output terminal of the second differential amplifier swing in the operating mode is smaller than the range of voltage in which the output clock signal swings.

7. The converter of claim 1, wherein the level maintenance circuit comprises:
    a first transistor;
    a second transistor;
    a third transistor connected in series to the first transistor;
    a fourth transistor connected in series to the second transistor;
    a first resistor and a second resistor located between a first node and a second node, where the first node is located between the first and third transistors and the second node is located between the second and fourth transistors; and
    a third resistor and a fourth resistor connected in series between the first and second nodes,
    wherein the output terminal of the first differential amplifier is connected between the first and second resistors, and the output terminal of the second differential amplifier is connected between the third and fourth resistors.

8. The converter of claim 7, wherein the level maintenance circuit further comprises:
- a fifth resistor and a sixth resistor connected in series between the first and second input terminals of the first differential amplifier; and
- a seventh resistor and an eighth resistor connected in series between the first and second input terminals of the second differential amplifier,
- wherein a gate of the third transistor is connected between the fifth and sixth resistors, and
- a gate of the fourth transistor is connected between the seventh and eighth resistors.

9. The converter of claim 7, wherein the gate of the third transistor is connected to a source of a first voltage that turns on the third transistor, and
- the gate of the fourth transistor is connected to a source of a second voltage that turns off the fourth transistor.

10. The converter of claim 7, wherein current flowing through the first transistor corresponds to current flowing through a current mirror of the first differential amplifier, and current flowing through the second transistor corresponds to current flowing through a current mirror of the second differential amplifier.

11. A circuit for outputting an amplified clock signal, comprising:
- a first input terminal for inputting a first clock signal;
- a second input terminal for inputting a second clock signal;
- a first amplifier circuit for amplifying the first clock signal and outputting a first amplified clock signal at a first output terminal;
- a second amplifier circuit for amplifying the second clock signal and outputting a second amplified clock signal at a second output terminal;
- a level maintenance circuit connected to the first output terminal and the second output terminal; and
- an output circuit connected to the first output terminal and the second output terminal and configured to output a further amplified clock signal based on the first amplified clock signal and the second amplified clock signal, wherein
- the level maintenance circuit is configured to reduce duty distortion in the further amplified clock signal.

12. The circuit of claim 11, wherein:
the level maintenance circuit is configured to lower a maximum voltage and raise a minimum voltage appearing at the first output terminal, and to lower a maximum voltage and raise a minimum voltage appearing at the second output terminal.

13. The circuit of claim 12, wherein:
the level maintenance circuit is configured to lower a maximum standby voltage and raise a minimum standby voltage appearing at the first output terminal, and to lower a maximum standby voltage and raise a minimum standby voltage appearing at the second output terminal, such that the minimum and maximum standby voltages appearing at the first and second output terminals are closer to the minimum and maximum voltages appearing at the first and second output terminals during operating mode.

14. The circuit of claim 11, wherein the level maintenance circuit further comprises:
- a first resistor and a second resistor located between a first node and a second node; and
- a third resistor and a fourth resistor connected in series between the first and second nodes,
- wherein the first output terminal is connected between the first and second resistors, and
- the second output terminal is connected between the third and fourth resistors.

15. The circuit of claim 11, wherein:
the first amplifier circuit comprises a differential amplifier that receives the first clock signal and the second clock signal and outputs the first amplified clock signal, and
the second amplifier circuit comprises a differential amplifier that receives the first clock signal and the second clock signal and outputs the second amplified clock signal.

* * * * *